(12) United States Patent
Kado et al.

(10) Patent No.: US 6,787,395 B2
(45) Date of Patent: *Sep. 7, 2004

(54) METHOD OF MANUFACTURING A MULTI-CHIP MODULE

(75) Inventors: Yoshiyuki Kado, Ome (JP); Tsukio Funaki, Ebina (JP); Hiroshi Kikuchi, Hidaka (JP); Ikuo Yoshida, Musashimurayama (JP)

(73) Assignees: Renesas Technology Corp., Tokyo (JP); Hitachi Hokkai Semiconductor, Ltd., Hokkaido (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/269,972

(22) Filed: Oct. 15, 2002

(65) Prior Publication Data

US 2003/0032218 A1 Feb. 13, 2003

Related U.S. Application Data

(63) Continuation of application No. 09/897,408, filed on Jul. 3, 2001, now Pat. No. 6,489,181.

(30) Foreign Application Priority Data

Jul. 7, 2000 (JP) .................................... 2000-207495

(51) Int. Cl.⁷ ............................................. H01L 21/44
(52) U.S. Cl. ...................... 438/118; 438/106; 438/108; 438/127
(58) Field of Search .............................. 438/106, 108, 438/118, 127

(56) References Cited

U.S. PATENT DOCUMENTS

| | | | |
|---|---|---|---|
| 5,891,758 A | 4/1999 | Honda et al. | 438/118 |
| 5,972,739 A | 10/1999 | Funada et al. | 438/127 |
| 6,046,495 A | 4/2000 | Urushima | 257/668 |
| 6,177,295 B1 | 1/2001 | De Samber et al. | 438/106 |
| 6,461,896 B1 * | 10/2002 | Imasu et al. | 438/108 |
| 6,489,181 B2 * | 12/2002 | Kado et al. | 438/108 |

FOREIGN PATENT DOCUMENTS

JP    11-297759    10/1999

OTHER PUBLICATIONS

S. A. Campbell, *The Science and Engineering of Microelectronic Fabrication*, Oxford University Press, Inc., New York, NY, 1996, pp. 355–358.

* cited by examiner

*Primary Examiner*—Vu A. Le
*Assistant Examiner*—Christian D. Wilson
(74) *Attorney, Agent, or Firm*—Miles & Stockbridge P.C.

(57) ABSTRACT

Silicon chip having narrow pitches of Au bumps are mounted on a module substrate in such a way that while taking into consideration a difference in coefficient of thermal expansion between the silicon chip and the module substrate, a total pitch of electrode pads of the silicon chip is made narrower than a total pitch of the Au bumps, thereby preventing misregistration between the Au bumps and the electrode pads in the course of heat treatment to ensure reliable contact therebetween.

8 Claims, 15 Drawing Sheets

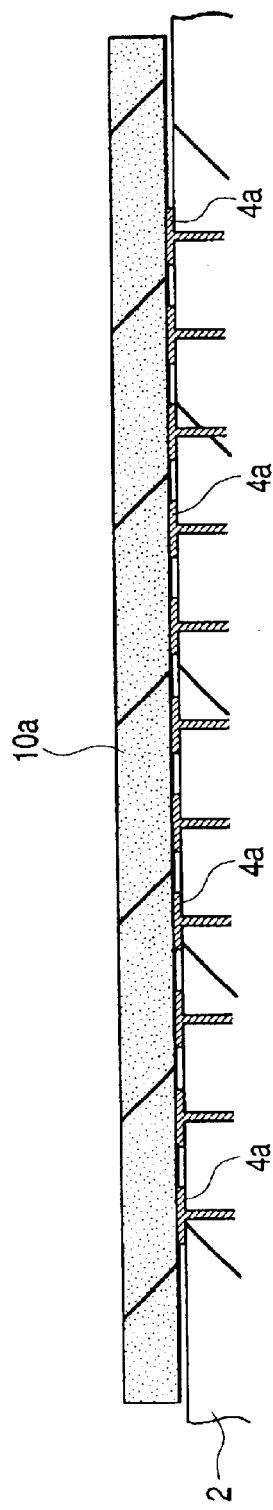
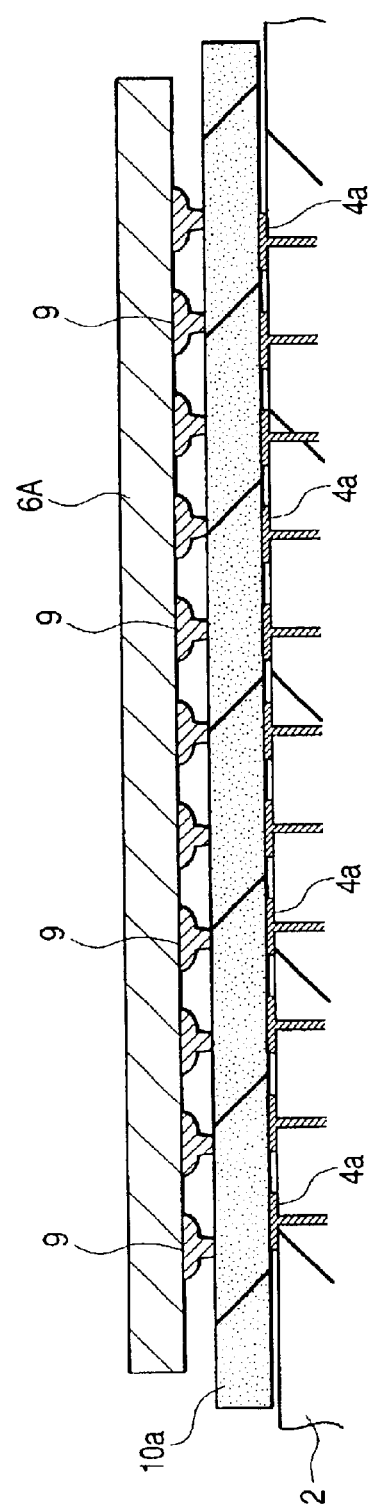

METHOD OF MANUFACTURING A MULTI-CHIP MODULE

CROSS-REFERENCE OF RELATED APPLICATION

This application is a continuation of application Ser. No. 09/897,408 filed Jul. 3, 2001 now U.S. Pat. No. 6,489,181.

FIELD OF THE INVENTION

This invention relates to a technique of manufacturing a semiconductor device, and more particularly, to a technique effective for application to a semiconductor device wherein semiconductor chips are subjected to flip chip mounting on a wiring board via bump electrodes.

BACKGROUND OF THE INVENTION

In Japanese Laid-open Patent Application No. Hei 11(1999)-297759, there is disclosed a technique wherein in order to permit an appropriate superposed area between an bump electrode and an electrode terminal in case where bump electrodes of a chip and electrode terminals of a substrate are misregistered with each other, the bump electrodes and the electrode terminals are arranged in a zigzag fashion so as to increase the area of individual bump electrodes and electrode terminals.

SUMMARY OF THE INVENTION

We have now developed a multi-chip module mounting a multitude of LSI chips on a printed wiring board. In order to realize high-density packaging of LSI chips, this multi-chip module adopts a flip chip mounting system wherein bump electrodes of Au (gold) (hereinafter referred to simply as Au bumps) formed on a main surface of a chip are individually connected to electrode pads (connection terminals) of a wiring board. Further, for the realization of high reliability at low costs, a so-called anisotropic conductive film (ACF), in which metal particles such as of Ni (nickel) are dispersed in an insulating film made of an epoxy resin, is provided between the chips and the wiring board so as to simultaneously ensure the electric connection between the Au bumps and the electrode pads, the mitigation of thermal stress, and the protection of the connections For mounting the chips on the wiring board via the anisotropic conductive film, the anisotropic conductive film, cut about the same size as the chip, is bonded to the electrode pads of the wiring board, and a chip having Au bumps preliminarily formed by use of a wire bonder is mounted on the anisotropic conductive film. Subsequently, the wiring board is heated while applying a compression pressure to the chip from above so that the anisotropic conductive film is melted and cured. Eventually, the Au bumps of the chip and the electrode pads of the wiring board are electrically connected via the metal particles in the film, and the space between the chip and the wiring board is filled up with the cured resin.

When the anisotropic conductive film is thermally treated for the melting and curing, the Au bumps and the electrode pad may be misregistered owing to the difference in coefficient of thermal expansion between the wiring board and the chip (3 ppm for silicon chip and about 14 ppm for a glass fiber-impregnated epoxy resin substrate).

In this connection, if the pitches of the electrode pads are relatively wide, the increase in width of the pads is sufficient to ensure the contact area between the Au bump and the electrode pad even though misregistration between the Au bumps and the electrode pads occurs. However, when the pitches of the electrode pads become narrow with the tendencies toward multiple terminals of a chip and narrow pitches, a difficulty is involved in extending the width of the electrode pad. This results in the misregistration between the Au bumps and the electrode pads, with a small contact area therebetween. Thus, connection reliability inconveniently lowers.

In order to cope with this, it may occur that the printed wiring board is made using a ceramic material whose coefficient of thermal expansion is smaller than resins so that the difference in the coefficient of thermal expansion with the chip is made smaller, with the attendant problem that the production costs of the substrate increases.

An object of the invention is to provide a technique of improving reliability of connection between a chip and a wiring board in a semiconductor device of the type wherein the chip is subjected to flip chip mounting on the wiring board via bump electrodes.

Another object of the invention is to provide a technique of connecting a chip and a wiring board at a high registration accuracy in a semiconductor device wherein the chip is flip-chip-bonded to the wiring board via bump electrodes.

A further object of the invention is to provide a technique of achieving the above objects without inviting an increase in production costs.

Other objects and novel features of the invention will become apparent from the description of the specification with reference to the accompanying drawings.

Typical embodiments of the invention are briefly summarized below.

A method of manufacturing a semiconductor device according to one embodiment of the invention comprises the steps of:

(a) providing a semiconductor chip having a plurality of bump electrodes on a main surface thereof;

(b) providing a wiring board which has a plurality of electrode pads on a main surface thereof in such a way that at least a part of pitches of the plurality of electrode pads is different from pitches of the plurality of bump electrodes formed on the main surface of the semiconductor chip; and (c) disposing the semiconductor chip to flip chip mounting on the main surface of the wiring board so that the plurality of bump electrodes are electrically connected to the plurality of electrode pads, respectively.

In the above method, a distance of one end to the other of the arrays of the plurality of electrode pads provided in the step (b) and formed on the main surface of the wiring board is smaller than a distance of from one end to the other of the arrays of the plurality of bump electrodes provided in the step (a) and formed on the main surface of the semiconductor chip.

A method of manufacturing a semiconductor device according to another embodiment of the invention comprises the steps of:

(a) providing first and second semiconductor chips each having a plurality of bump electrodes on a main surface thereof;

(b) providing a wiring board having a plurality of electrode pads on a main surface thereof in such a way that at least a part of the plurality of electrode pads has pitches different from pitches of the plurality of bump electrodes formed on the main surface of each of the first and second semiconductor chips; and (c) disposing the first and second semiconductor chips to flip chip mounting on the main surface of the wiring board so that the plurality of bump electrodes are electrically connected to the plurality of electrode pads, respectively.

BRIEF DESCRIPTION OF THE DRAWINGS

FIG. 9 is a section view showing a manufacturing step in a method of manufacturing a semiconductor device according to one embodiment of the invention;

FIG. 10 is a section view showing another step in the method of manufacturing a semiconductor device according to one embodiment of the invention;

DESCRIPTION OF THE PREFERRED EMBODIMENTS

Figure 1:
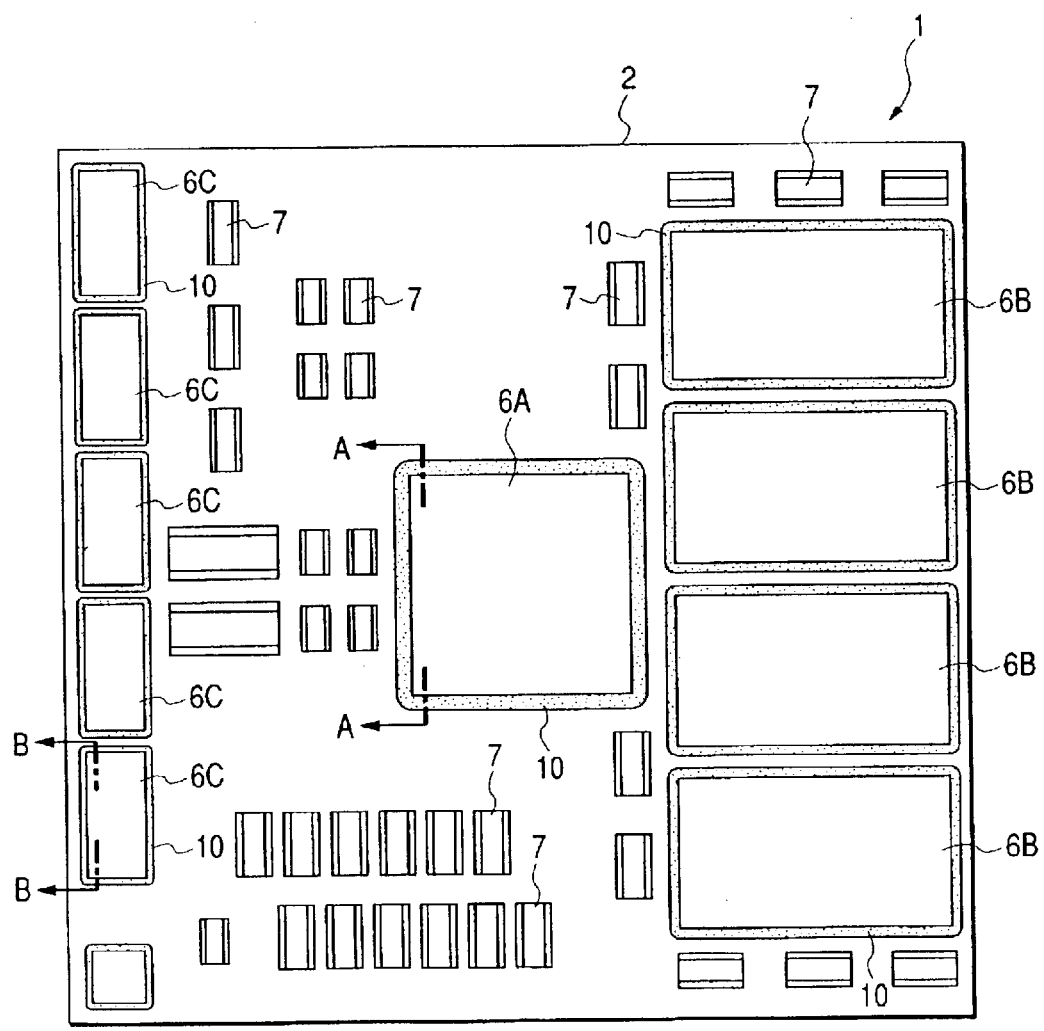
FIG. 1 is a plan view showing a semiconductor according to one embodiment of the invention.

Embodiments of the invention are described with reference to the accompanying drawings. In the drawings, like reference numerals indicate like members, which may not be repeatedly illustrated.

Figure 2A:
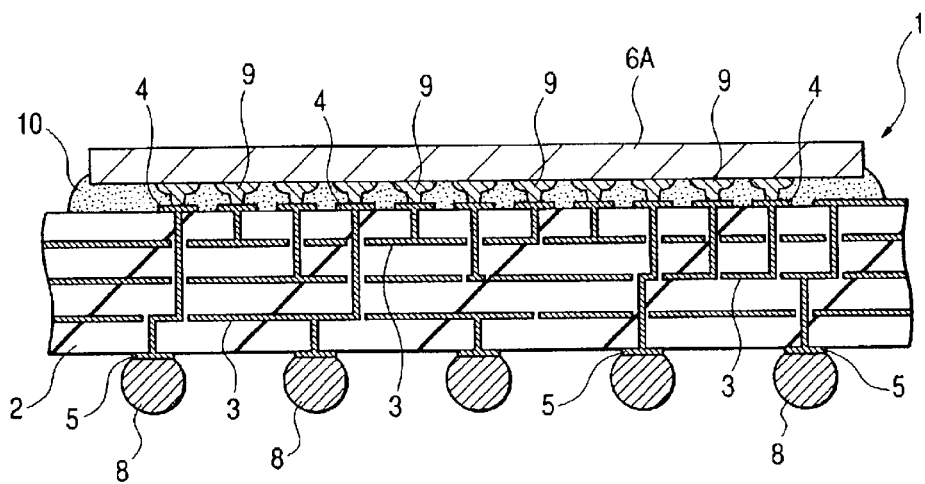
FIGS. 2(a) and 2(b) are, respectively, sectional views taken along lines A—A and B—B of FIG. 1.
Figure 2B:
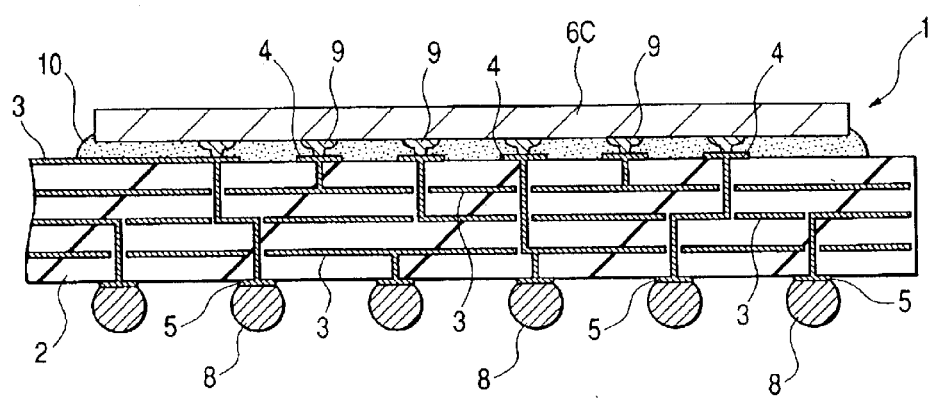

FIG. 1 is a plan view showing a semiconductor device embodying the invention, FIG. 2(a) is a sectional view take along line A—A of FIG. 1 and FIG. 2(b) is a sectional view taken along line B—B of FIG. 1.

The semiconductor device of this embodiment is a multi-chip module (MCM) mounting LSI's such as a high-speed processor (MPU: microprocessor unit), a main memory, buffer memories and the like.

A multi-chip module 1 has a module substrate 2 made of a glass fiber-impregnated epoxy (usually called "glaepo") resin. The substrate 2 has multi-layered wirings 3 including signal wirings, power wirings and ground wirings and the like in the inside thereof. A plurality of electrode pads 4, 5, electrically connected to the wirings 3, are formed on a main surface (upper surface) and a lower surface of the module substrate 2. The wirings 3 and the electrode pads 4, 5 are each made of Cu (copper), and the electrode pads 4, 5 are individually plated with Ni (nickel) and Au (gold).

The module substrate 2 has, on the main surface thereof, one silicon chip 6A wherein MPU is formed, a plurality of silicon chips 6B wherein a main memory (DRAM) is formed, a plurality of silicon chips 6C wherein a buffer memory is formed, and a plurality of passive elements 7 (capacitors, resistors), and the like. The electrode pads 5 provided at the lower surface of the module substrate 2 are each connected with a solder bump serving as an external connection terminal for mounting the module substrate 2 to a mother board or the like.

The silicon chips 6A, 6B and 6C are, respectively, mounted on the main surface of the module substrate 2 according to a flip chip system. More particularly, the silicon chips 6A, 6B and 6C are electrically connected to the electrode pads 4 of the module substrate 2 via a plurality of Au bumps 9 formed on the main surface (element-forming surface), respectively. The passive elements 7 are mounted by soldering on the main surface of the module substrate 2.

The silicon chips 6A, 6B and 6C, respectively, have the Au bumps 9, which are different in number and pitch depending on the type of LSI formed on the main surface. For instance, with the silicon chip 6A formed with MPU shown in FIG. 2(a), the terminals (Au bumps 9) are large in number (e.g. 249 pins) and the pitch between adjacent Au bumps 9 is narrow (e.g. 40 μm to 50 μm). This requires that the electrode pads 4 of the module substrate 2 to be connected with the Au bumps 9 be arranged to be correspondingly small in width and in pitch between adjacent electrode pads 4.

In contrast, the silicon chip 68 formed with DRAM has terminals (Au bumps) of, for example, as small as 74 pins. Nevertheless, the terminals are arranged in line at the center, and the pitch between adjacent Au bumps 9 is narrow (e.g. 40 μm to 50 μm). Accordingly, the electrode pads 4 of the module substrate 2 to be connected with the Au bumps 9 of the silicon chip 6B are made narrow in width and pitch between adjacent electrode pads 4.

With respect to the silicon chip 6C formed with a buffer as shown in FIG. 2(b), the number of terminals is, for example, at 70 pins, which are peripherally arranged along the four sides of the main surface, so that the pitch between adjacent Au bumps 9 is widened (.e.g. 100 μm to 110 μm). Accordingly, the electrode pads 4 of the module substrate 2 to be connected with the Au bumps of the silicon chip 6C are arranged to be large in width and in pitch between adjacent electrode pads 4.

Figure 3:
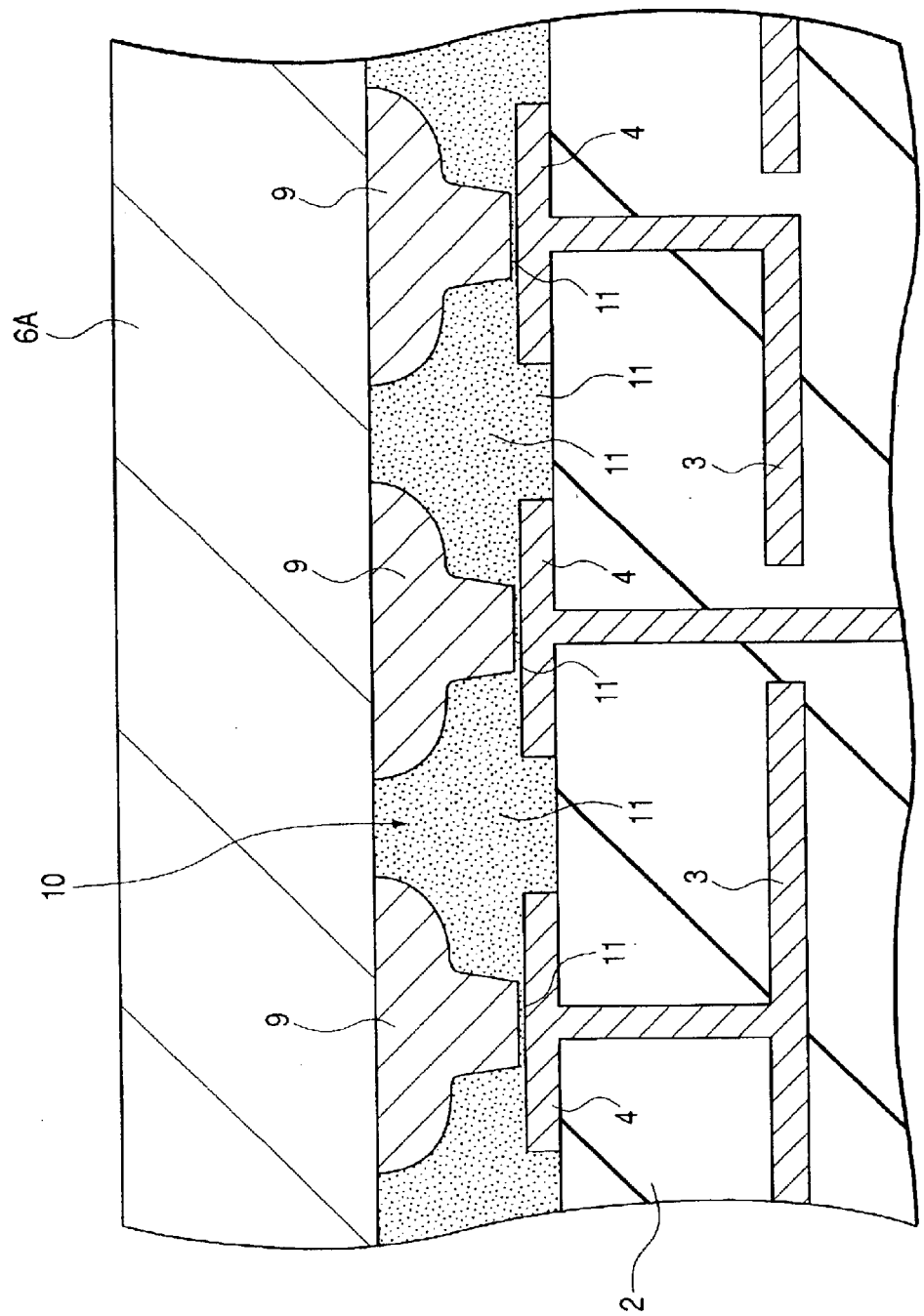
FIG. 3 is an enlarged sectional view showing an essential part of FIG. 2(a)

An anisotropic conductive resin 10 is filled between each of the silicon chips 6A, 6B and 6C and the module substrate 2. The anisotropic conductive resin 10 is one wherein metal particle such as Ni (nickel) are dispersed in a thermosetting epoxy resin. As shown in FIG. 3 as enlarged, the Au bumps formed on the respective main surfaces of the silicon chips 6A, 6B and 6C and the corresponding electrode pads 4 of the module substrate 2 are electrically connected via metal particles 11 in the anisotropic conductive resin. The filling of the anisotropic conductive resin between the silicon chips 6A, 6B and 6C and the module substrate 2 not only permits the electric connection between the Au bumps 9 and the electrode pads 4, but also serves for protection of the connections and mitigation of a thermal stress.

In order to assemble the multi-chip module 1 arranged in this way, the module substrate 2, and active elements (silicon chips 6A, 6B, 6C and the like) and passive elements (capacitors, resistors) 7 mounted on the main surface thereof are initially provided, respectively.

Figure 4A:
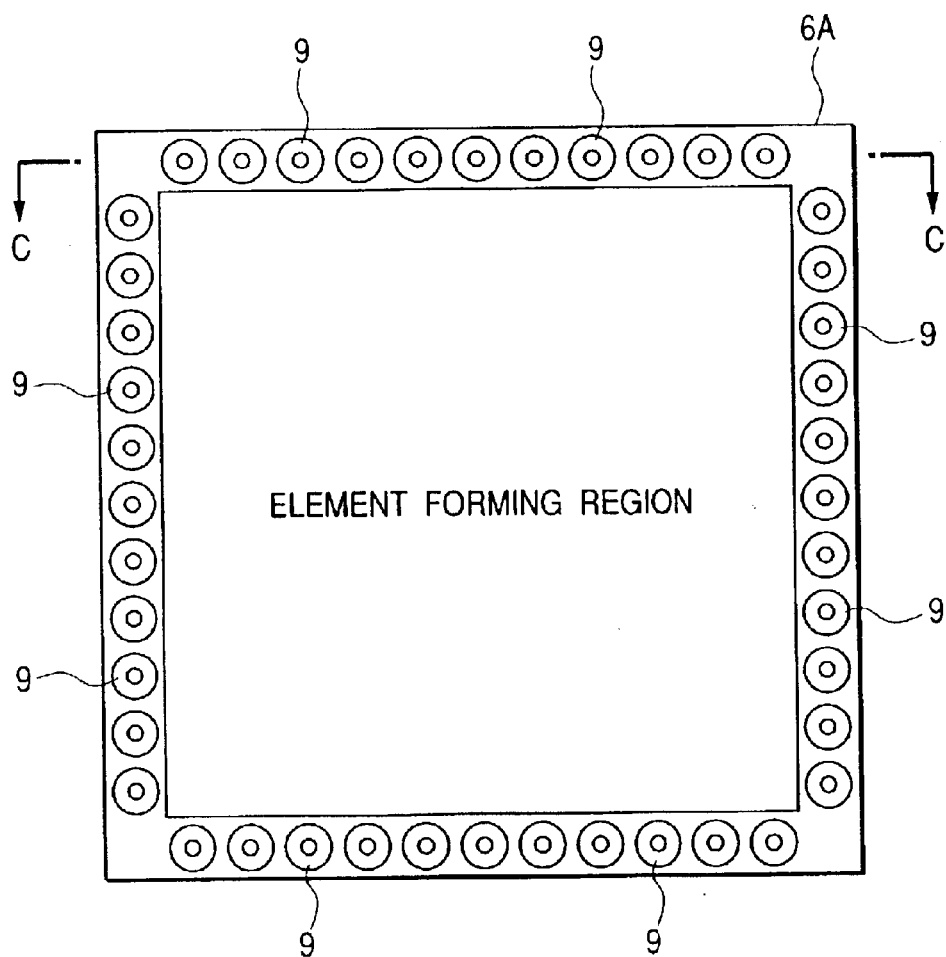
FIG. 4(a) is a plan view showing a main surface of a silicon chip formed with MPU and FIG. 4(b) is a sectional view taken along line C—C of FIG. 4(a)
Figure 4B:
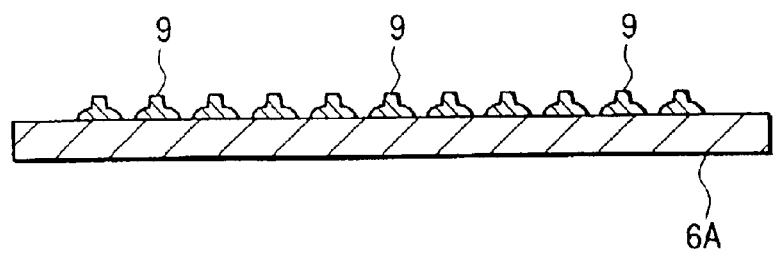
Figure 5A:
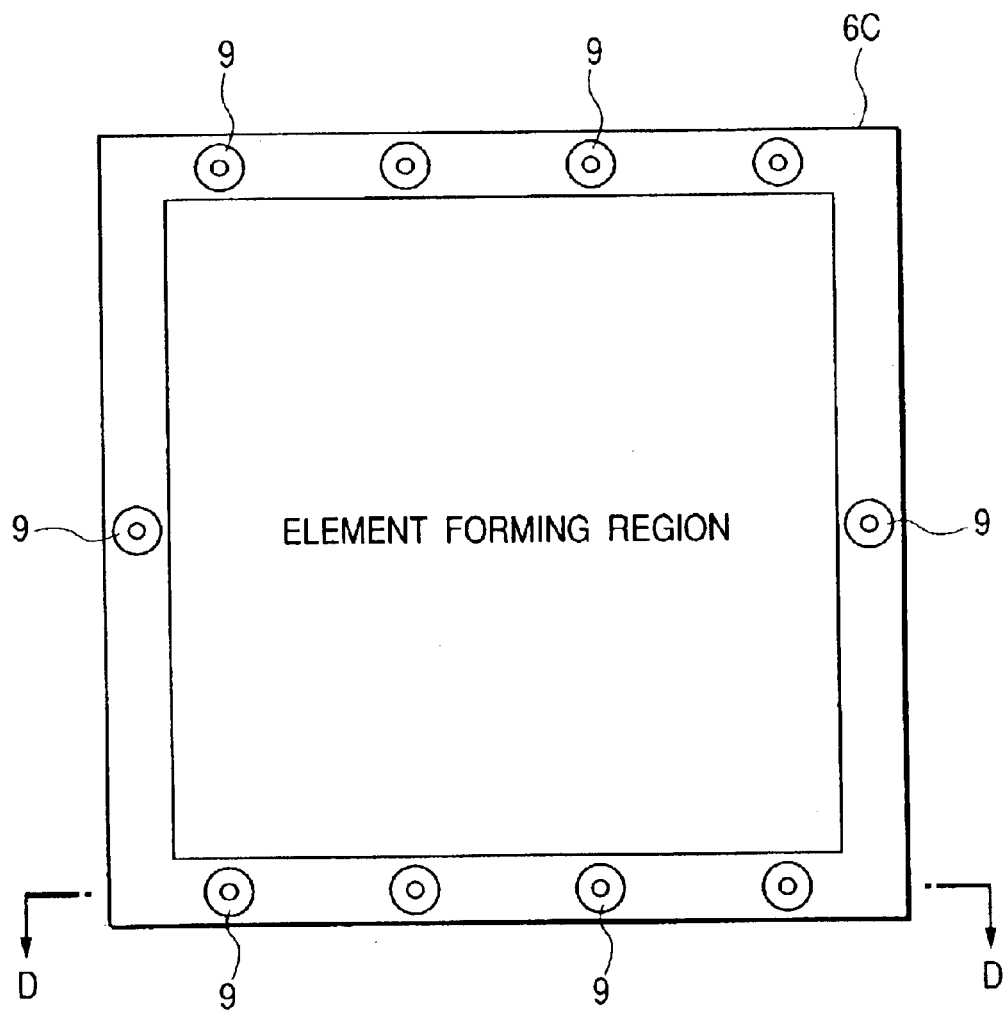
FIG. 5(a) is a plan view showing a main surface of a silicon chip formed with a buffer memory and FIG. 5(b) is a sectional view taken along line D—D of FIG. 5(a)
Figure 5B:
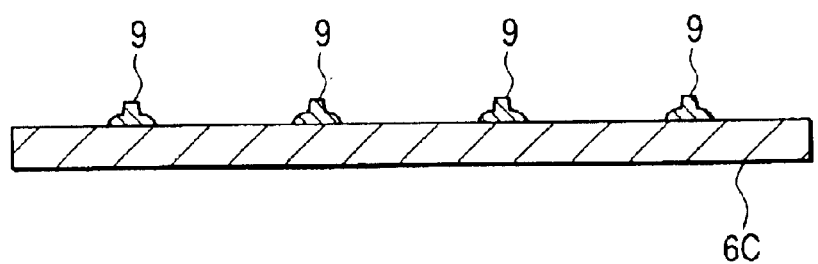

The Au bumps 9 have been preliminarily formed on the silicon chips 6A, 6B, 6C according to a known wire bonding technique using an Au wire, respectively. FIG. 4(a) is a plan view of the main surface of the silicon chip 6A, FIG. 4(b) is a sectional view taken along line C—C of FIG. 4(a), and FIG. 4(c) is a sectional view taken along line D—D of FIG. 4(a).

The Au bumps 9 are connected to bonding pads (not shown) formed on a peripheral portion at the main surfaces of the silicon chips 6A, 6C, or outside an element-forming region, and arranged in a line along the respective sides of the chips 6A, 6C and at equal pitches. The diameter of the Au bump 9 is, for example, at approximately 50 µm to 55 µm. As stated hereinbefore, the Au bumps of the silicon chip 6A is arranged at pitches as narrow as approximately 40 µm to 50 µm, and the Au bumps 9 of the silicon chip 6C are arranged at pitches as wide as approximately 100 µm to 110 µm. Although not shown, the Au bumps 9 are formed on the main surface of the silicon chip 6B formed with a main memory (DRAM) by a similar technique as set out above. The Au bumps 9 of the silicon chip 6B has the Au bumps 9 whose pitches are substantially same as those of the Au bumps of the silicon chip 6A and are as small as approximately 40 µm to 50 µm, and are arranged substantially in line at the center of the chip main surface. The Au bumps shown in the figures are reduced in number over actually employed ones.

Figure 6:
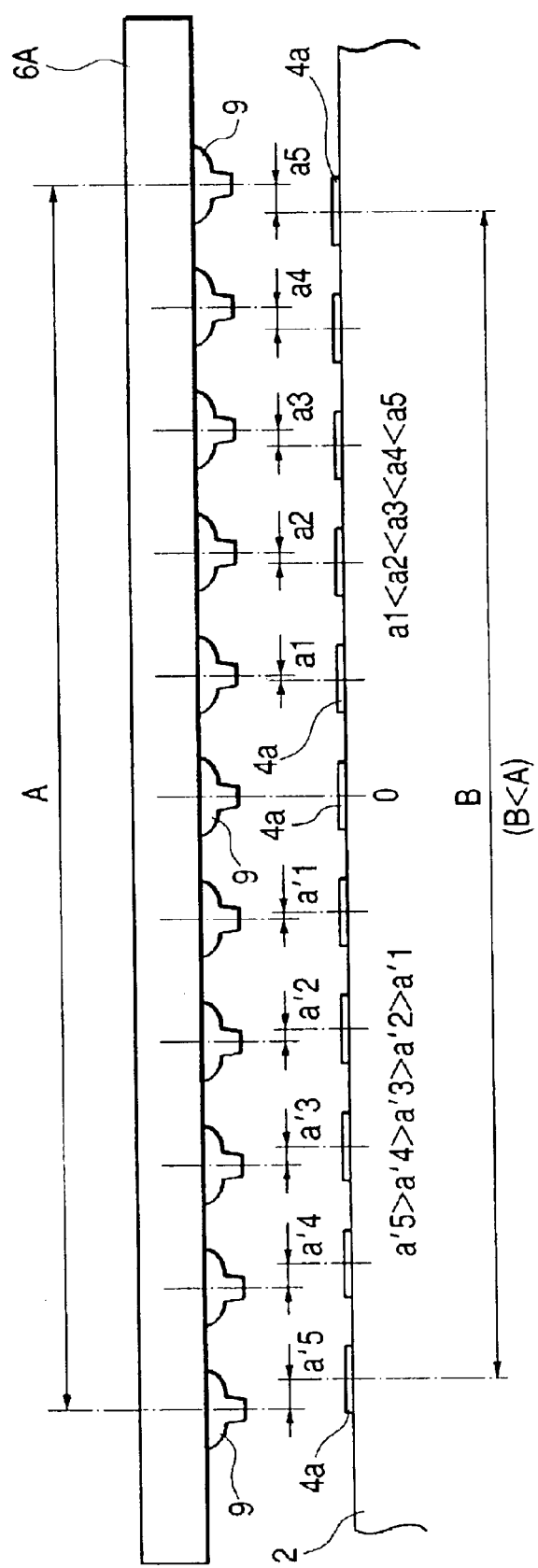
FIG. 6 is a schematic view showing the relative positional relation between Au bumps located along one side of a silicon chip formed with MPU and electrode pads of a corresponding module substrate.

The relation between the pitches of the Au bumps 9 formed on the silicon chips 6A, 6B and 6C and the pitches of the electrode pads 4 formed on the module substrate 2 is described. FIG. 6 is a view showing the relative positional relationship between the Au bumps 9 arranged in a line along one side of the silicon chip 6A formed with MPU and the electrode pads 4a of the corresponding module substrate 2.

As shown, pitch A between the Au bump 9 provided at one end of one side of the silicon chip 6A (left side end) and the Au bump 9 provided at the other end (right side end) (this pitch A is hereinafter referred to as total pitch) is wider than total pitch B between the electrode pads 4a, 4a corresponding to the two Au bumps 9, 9, respectively (i. e. A>B), at normal temperatures or within a temperature range where the semiconductor device is operated. Moreover, the pitches between adjacent Au bumps 9 of the silicon chip 6A become wider than the pitches between corresponding electrode pads 4a of the module substrate 2.

When a degree of misregistration (a) of the Au bump 9 positioned at the center of one side of the silicon chip 6A relative to a corresponding electrode pad 4a is taken as 0, a degree of misregistration (a) of an Au bump 9 relative to a corresponding electrode pad 4a is such that the degree of misregistration of an electrode pad 4a arranged at a position more distant from the electrode pad 4a at the center becomes greater (i.e. $0<a_1<a_2<a_3<a_4<a_5$ and $0<a'_1<a'_2<a'_3<a'_4<a'_5$). Although not particularly shown, the Au bumps 9 and corresponding electrode pads 4a arranged at the other three sides of the silicon chip 6A, respectively, have a similar positional relation as stated above.

Figure 7:
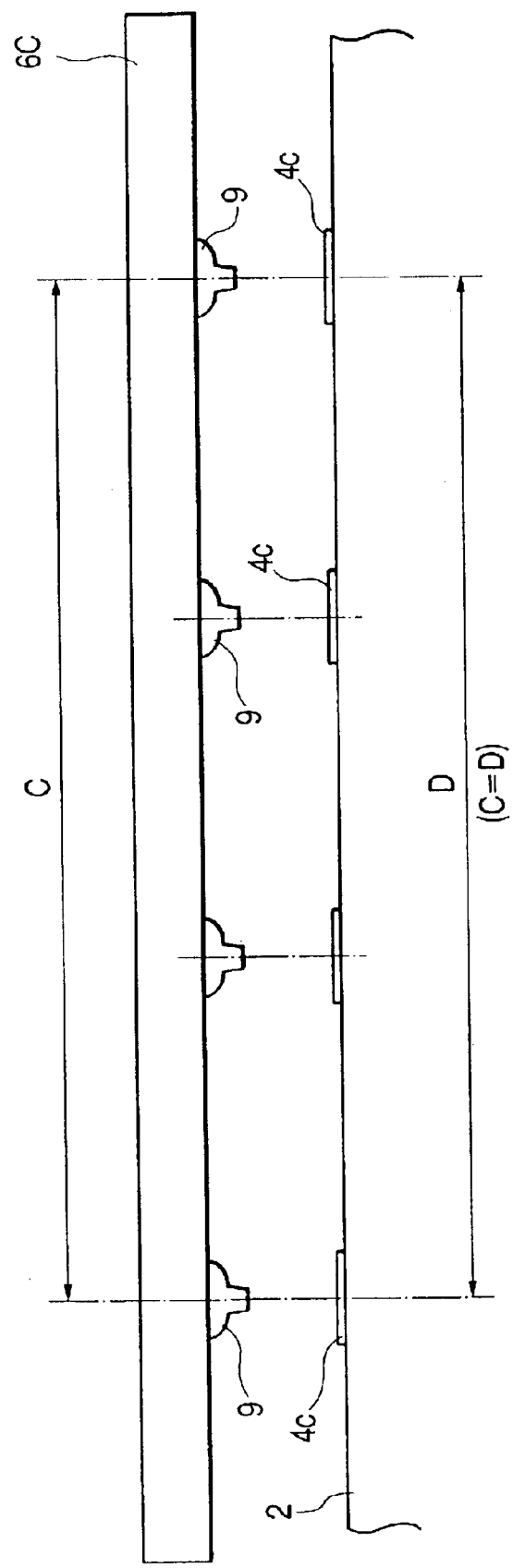
FIG. 7 is a schematic view showing the relative positional relation between Au bumps located along one side of a silicon chip formed with MPU and electrode pads of a corresponding module substrate.

FIG. 7 is a view showing the relative positional relation between the Au bumps 9 arranged in line along one side of the silicon chip 6C formed with a buffer and the electrode pads 4c of a corresponding module substrate 2.

As shown, total pitch C between the Au bump arranged at one side end (left end) of the silicon chip 6C and the Au bump 9 arranged at the other end (right end) is equal to total pitch D of two electrode pads 4c, 4c corresponding to the two Au bumps 9, 9 (C=D).

The Au bumps 9 of the silicon chip 6C are so arranged that all pitches between adjacent Au bumps 9 are equal to one another, and the electrode pads 4c to be connected to the Au bumps 9 are also arranged such that all pitches between adjacent electrode pads 4c are equal to one another. Accordingly, when a degree of misregistration between an arbitrary Au bump 9 and a corresponding electrode pad 4c is taken as 0, a degree of misregistration between any other Au bump 9 and a corresponding electrode pad 4c is at 0 in all cases.

The electrode pads 4c to be connected to the Au bumps 9 of the silicon chip 6C have a width larger than the electrode pads 4a to be connected to the Au bumps 9 of the silicon chip 6A. For instance, when the width of the electrode pads 4a, 4b are at 20 µm to 25 µm, the width of the electrode pad 4c is set at 50 µm to 55 µm. It will be noted that the positional relation between the Au bumps arranged along the other three sides of the silicon chip 6C and corresponding electrode pads 4c are similar to that stated hereinabove.

Although not particularly shown in the figure, the relative positional relation between the Au bumps 9 of the silicon chip 6B formed with DRAM and corresponding electrode pads 4b is the same as that for the silicon chip 6A shown in FIG. 6. More particularly, the total pitch of the Au bumps 9 arranged in line along the respective sides of the silicon chip 6B is wider than the total pitch of corresponding electrode pads 4b. In addition, the pitch between adjacent Au bumps 9 of the silicon chip 6B is larger than the pitch between corresponding adjacent electrode pads 4b of the module substrate 2. More specifically, when an electrode pad 4b located at a position closest to the center of the module substrate 2 is taken as a reference point, an electrode pad 4b located at a position which is more distant from the pad 4b at the reference point or closer to the peripheral portion of the module substrate 2 is more misregistered with a corresponding Au bump 9.

In this way, according to this embodiment, when the silicon chips 6A, 6B having narrow pitches of the Au bumps 9 are mounted, the total pitch of corresponding electrode pads is made smaller than the total pitch of the Au bumps 9. In this connection, the total pitch of the electrode pads 4 is calculated using parameters including a difference in coefficient of thermal expansion between silicon constituting the chip and a resin material (e.g. an epoxy resin in this embodiment) constitution the module substrate 2, the total pitch of the Au bumps 9, the position of the electrode pads 4 in the module substrate 2, a thermal treating temperature upon mounting of chips described hereinafter, and the like.

Figure 8:
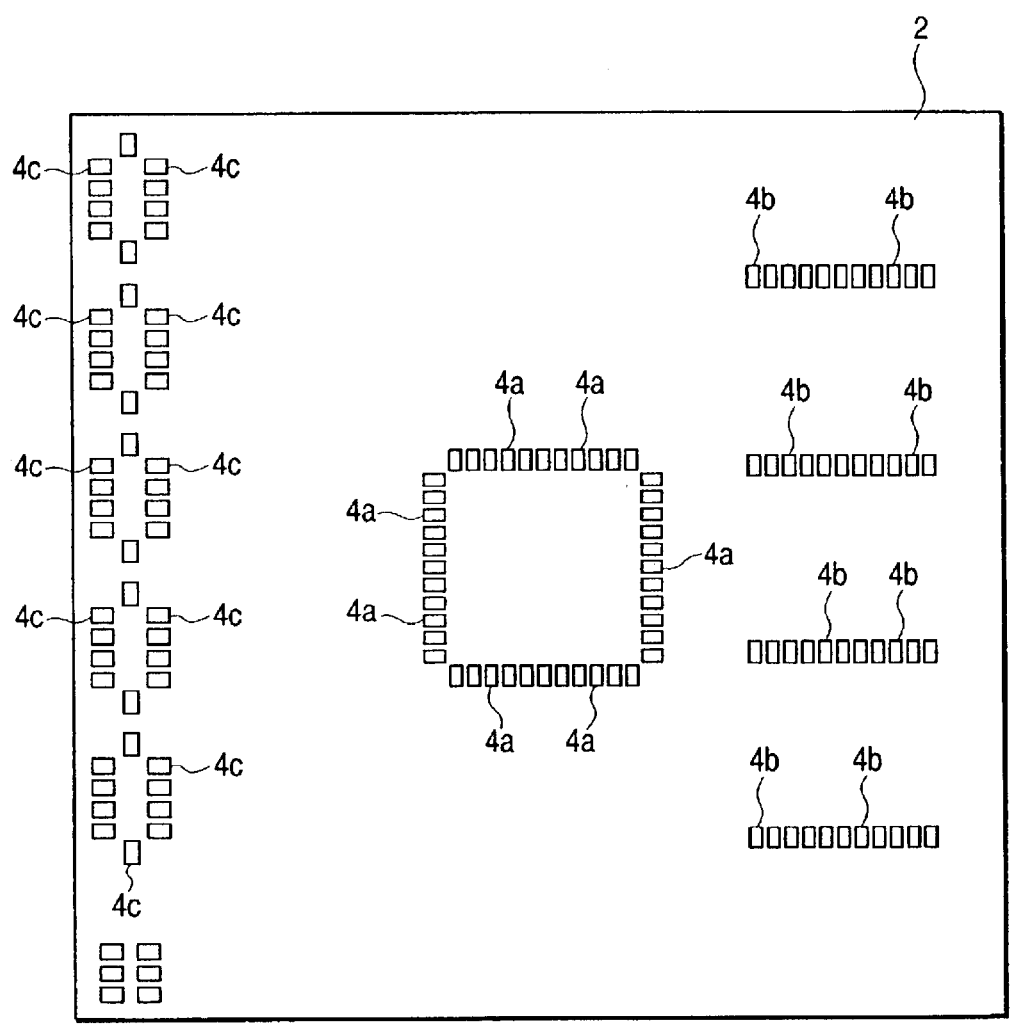
FIG. 8 is a plan view showing a main surface of a module substrate showing the layout of electrode pads.

FIG. 8 is a plan view showing the main surface of the module substrate 2 showing a layout of electrode pads 4 (4a, 4b, 4c) for connection with the Au bumps 9 of the silicon chips 6A, 6B, 6C. It will be noted that the electrode pads 4 for connection with passive elements and wirings 3 for mutual connection of the electrode pads 4 are not shown in this figure.

As shown, the electrode pads 4c, to which the Au bumps of the silicon chip 6C are connected, are made wide in width and pitch owing to the wide pitch of the Au bumps 9. In contrast, the electrode pads 4a, 4b of the silicon chips 6A, 6B for connection with the Au bumps 9 are, respectively, made small in width and pitch because the pitches of the Au bumps are narrow. Next, the procedure of mounting the silicon chips 6a, 6b and 6C over the module substrate 2 is described.

For mounting the silicon chip 6A having narrow pitches of the Au bumps 9 over the module substrate 2, as shown in FIG. 9, an anisotropic conductive film 10a is attached on the electrode pads 4a of the module substrate 2. The anisotropic conductive film 10a is obtained by processing an uncured epoxy resin dispersing metal particles such as Ni (nickel) into a film. The resin film is cut about the same size as the silicon chip 6A, followed by attaching on the electrode pads 4a by use of an adhesive.

Next, as shown in FIG. 10, the silicon chip 6A is mounted on the upper surface of the anisotropic conductive film 10a. For the mounting, shown in the figure, the Au bump 9 positioned at the center of one side of the silicon chip 6A and a corresponding electrode pad 4a are registered so that a degree of misregistration therebetween in the direction of the section as viewed in the figure is substantially at zero.

Figure 11:
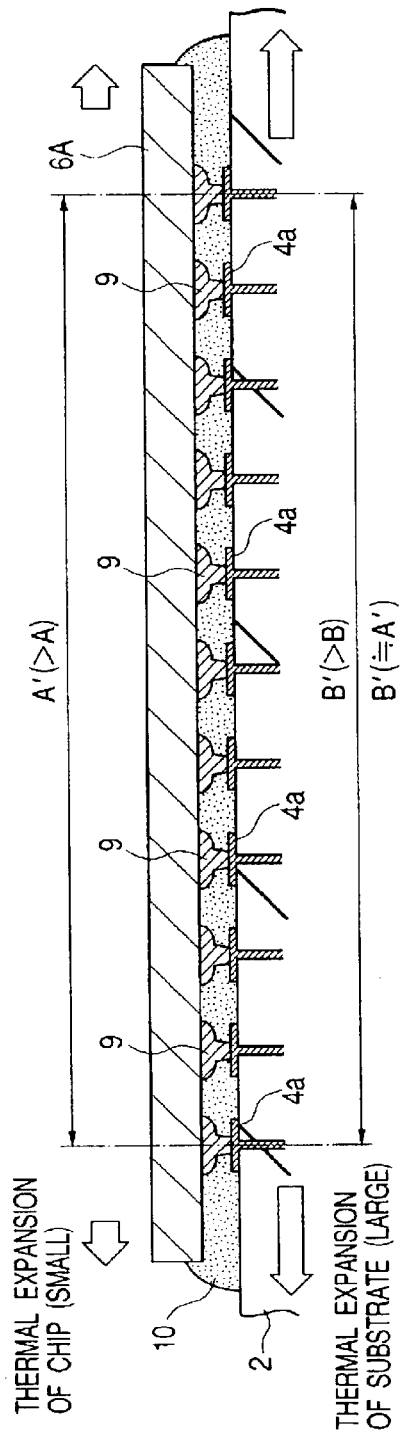
FIG. 11 is a section view showing a further step in the method of manufacturing a semiconductor device according to one embodiment of the invention.
Figure 12:
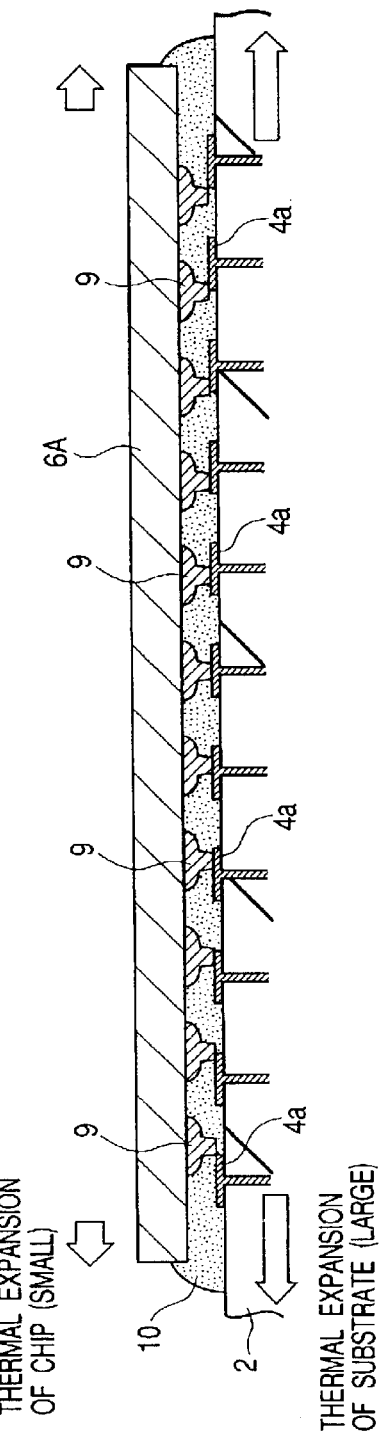
FIG. 12 is a section view showing a still further step in the method of manufacturing a semiconductor device according to one embodiment of the invention.

Thereafter, a pressurizing tool (not shown) is urged from above so as to apply a compression pressure of approximately 10 to 20 kg/cm² to the upper surface of the silicon chip 6A, under which the module substrate 2 is heated to approximately 180° C., followed by once melting the anisotropic conductive film 10a and curing. In this manner, as shown in FIG. 11, the space between the silicon chip 6A and the module substrate 2 is filled with the anisotropic conductive resin 10, and the Au bumps 9 and the electrode pads 4a are electrically connected via the metal particles in the resin.

The thermal treatment permits the silicon chip 6A and the module substrate 2 to be thermally expanded, respectively. This makes total pitch A' between the two Au bumps 9, 9 positioned at opposite ends at one side of the silicon chip 6A to be extended (A'>A), along with total pitch B' between two corresponding 4a, 4a being extended (B'>B).

In this connection, the coefficient of thermal expansion of the silicon chip 6A is at 3 ppm and the coefficient of thermal expansion of the module substrate 2 made mainly of an epoxy resin is at approximately 14 ppm, so that the module substrate 2 is greater in dimensional variation than the silicon chip 6A. More particularly, a difference between the total pitch in the course of the thermal treatment and the total pitch prior to the thermal treatment. (i.e. A'–A, B'–B) in the module substrate 2 is greater than in the silicon chip 6A ((A'–A)<(B'–B)). Hence, when the thermal treatment is carried out, an electrode pad 4a provided at a position nearer to the opposite ends of the electrode pad 4a array has a greater degree of misregistration relative to the Au bump 9 in comparison with the case prior to the thermal treatment.

In this connection, however, as shown in FIG. 6, total pitch B of the electrode pads 4a has been preliminarily made narrower than total pitch A of the Au bumps 9 according to this embodiment and the electrode pad 4a provided at a position nearer to the opposite ends of the array of the electrode pads 4a is made greater in degree of misregistration with a corresponding Au bump 9. In this state, as a temperature increases in the course of the thermal treatment, an Au bump 9 and a corresponding electrode pad 4a come nearer to each other. Upon arrival at a temperature at which the anisotropic conductive film 10a is melted and cured, the degree of misregistration of both becomes substantially zero for all the electrode pads 4a.

The anisotropic conductive film 10a has been thermally treated to melt and cure the film and the anisotropic conductive resin 10 is filled in the space between the silicon chip 6A and the module substrate 2, under which the Au bumps 9 and the electrode pads 4a are sealed with the anisotropic conductive resin 10. Accordingly, when the silicon chip 6A and the module substrate 2 are shrunk in the course of cooling down to room temperature, the Au bumps 9 and the electrode pads 9a are not caused to be misregistered again.

In contrast, in case where total pitch B of the electrode pads 4a has been beforehand coincided with total pitch A of the Au bumps 9 and, prior to thermal treatment, a degree of misregistration between an Au bump 9 and a corresponding electrode pad 4a is set at 0 for all the electrode pads 5a, an electrode pad 4a nearer to the opposite ends of the array of the electrode pads 4a suffers a greater degree of misregistration, disenabling one to ensure a satisfactory contact area therebetween.

Figure 13:
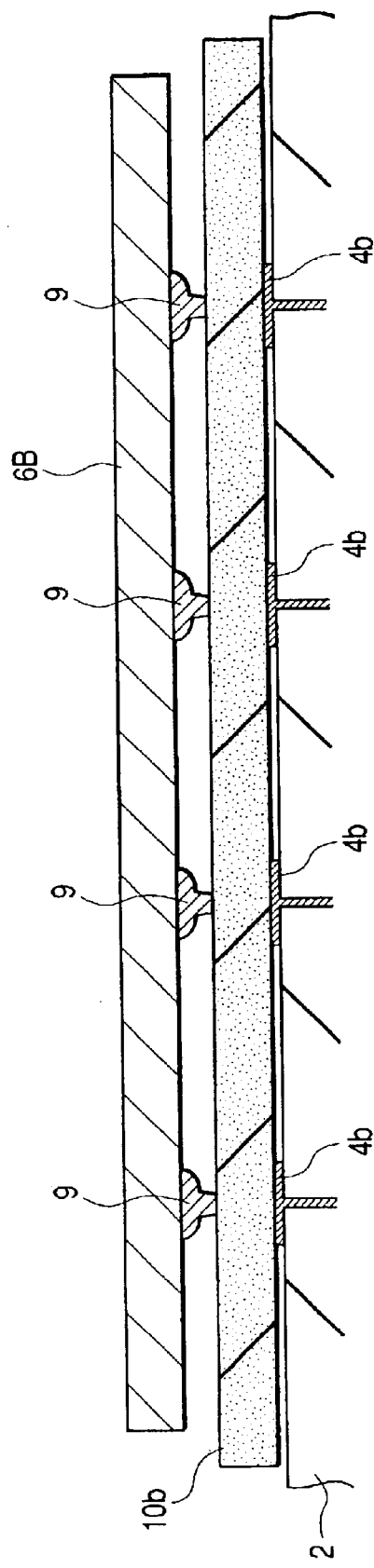
FIG. 13 is a section view showing a yet further step in the method of manufacturing a semiconductor device according to one embodiment of the invention.

For mounting the silicon chip 6C having wide pitches of the Au bumps on the module substrate 2, as shown in FIG. 13, an anisotropic conductive film 10b is attached to the electrode pads 4c of the module substrate 2, after which the silicon chip 6C is mounted thereover so as to permit all the Au bumps 9 and corresponding electrode pads 4c to be registered substantially at a degree of misregistration of zero.

Figure 14:
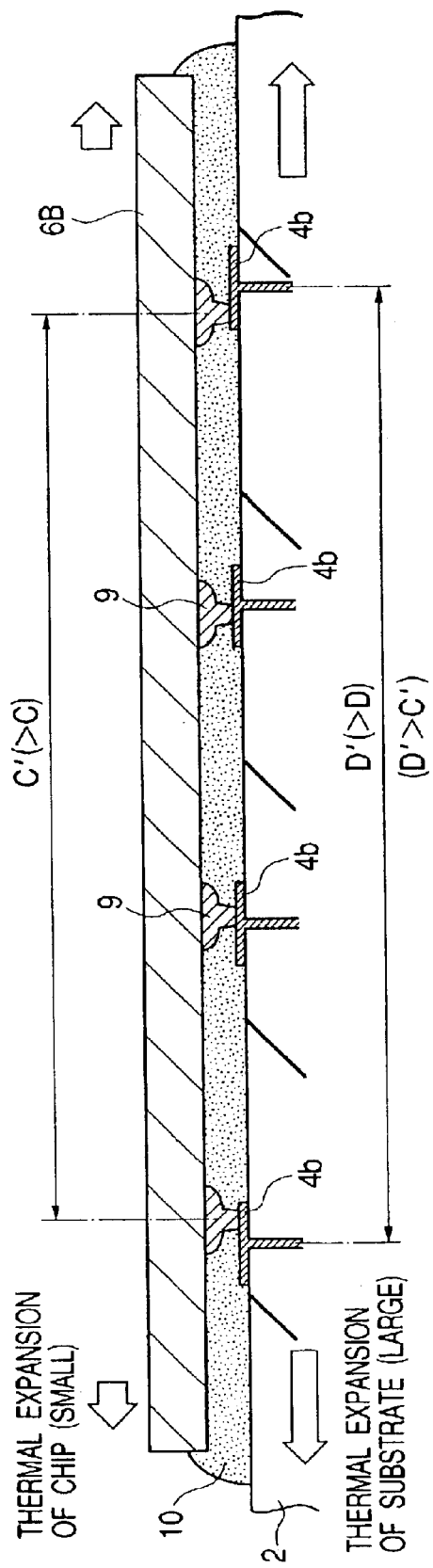
FIG. 14 is a section view showing another in the method of manufacturing a semiconductor device according to one embodiment of the invention.

Next, a compression pressure of approximately 10 to 20 kg/cm² is applied to the upper surface of the silicon chip 6C by urging a pressurizing tool (not:shown) from above, under which the module substrate 2 is heated to approximately 180° C. to melt and cure the anisotropic conductive film 10b. As a result, as shown in FIG. 14, the space between the silicon chip 6C and the module substrate 2 is filled up with the anisotropic conductive resin 10, thereby permitting the Au bumps 9 and the electrode pads 4cto be electrically connected via the metal particles in the resin.

The thermal treatment allows the module substrate 2 and the silicon chip 6C to be thermally expanded, so that total pitch C' between the two Au bumps 9,9 arranged at the opposite ends at one side of the silicon chip 6C is extended (C'>C) simultaneously with total pitch D' between corresponding two electrode pads 4c, 4c being extended (D'>D). Because the module substrate 2 having a larger coefficient of thermal expansion is more thermally expanded than the silicon chip 6c, an electrode pad 4c arranged more nearly to the opposite ends of the array of the electrode pads 4c becomes wider in pitch with an adjacent electrode pad 4c. Thus, a degree of misregistration with the Au bump 9 becomes greater than that prior to the thermal treatment.

In accordance with the embodiment of the invention, however, the electrode pads 4c have been preliminarily arranged to be wide enough to ensure a satisfactory contact area of both even when misregistration between the electrode pads 4c and corresponding Au bumps 9 are caused through the thermal treatment.

It will be noted that the multi-chip module 1 of this embodiment is arranged to mount four silicon chips 6B on the module substrate 2 (see FIG. 1). To this end, in the actual manufacturing process, an anisotropic conductive film 10b is attached to the electrode pads 4b of the module substrate 2, after which four silicon chips 6b are mounted on the upper surface thereof, followed by urging a pressurizing tool simultaneously against the four silicon chips 6B and heating the module substrate 2. In this case, the anisotropic conductive film 10b may have a cut size sufficient to cover the entire mounting area of the four silicon chips 6B.

Where the silicon chip 6B has the same thickness as the silicon chip 6A, these silicon chips 6A, 6B may be simultaneously mounted at one time. If the silicon chips 6A, 6B are different in thickness from each other, a thinner chip (i.e. a chip having a lower mounting height) is initially mounted. In this way, when a pressurizing tool is pressed against a chip, an inconvenient contact of the pressurizing tool with the previously mounted chip can be avoided.

Although not shown in the figures, the silicon chip B is mounted over the module substrate 2 in the same manner as a method of mounting the silicon chip 6A on the module substrate 2. As stated hereinbefore, with the silicon chip 6B having narrow pitches of the Au bumps 9, the total pitch of the electrode pads 4b has been preliminarily made smaller than the total pitch of the Au bumps 9, like the silicon chip 6A. When the thermal treatment is effected so as to fill up the anisotropic conductive resin 10 in the space with the module substrate 2, the degree of misregistration between the Au bumps 9 and the electrode pads 4b becomes substantially zero for all the electrode pads 4b.

According to the procedures stated hereinabove, the silicon chips 6A, 6B and 6C are mounted on the module substrate 2 successively or at a time. After or prior to this mounting, the passive elements 7 are mounted on the main surface of the module substrate 2 to complete the multi-chip module 1 shown in FIG. 1. It will be noted that where the thermal treating temperature for filling the anisotropic conductive resin 10 in the space between the silicon chips 6A, 6B, 6C and the module substrate 2 is higher than a reflow temperature of a solder, the passive elements 7 are mounted after mounting of the silicon chips 6A, 6B, 6C, thereby preventing undesirable re-melting of the solder in the mounting steps of the silicon chips 6A, 6B and 6C.

In this embodiment, when the silicon chips 6A, 6B having narrow pitches of the Au bumps 9 are mounted on the module substrate 2, the total pitch of the electrode pads 4 has been beforehand made smaller than the total pitch of the Au bumps 9 while taking the difference in coefficient of thermal expansion between the silicon chips 6A, 6B and the module substrate 2. This enables one to prevent the misregistration between the Au bumps 9 and the electrode pads 4 at the time of the thermal treatment. Thus, the contact area of both Au bumps 9 and electrode pads 4 is ensured. Thus, the reliability of connection between the silicon chips 6A, 6B and the module substrate 2 can be improved without use of an expensive ceramic substrate. Thus, the multi-chip module 1 suited for high density mounting can be provided inexpensively.

In Embodiment 1, application to the manufacture of a multi-chip module wherein silicon chips are mounted on a module substrate via an anisotropic conductive resin has been described. The invention is not limited to such an application, but also is widely applicable to semiconductor devices wherein a high temperature thermal treatment is carried out in the step of subjecting silicon chips to flip chip mounting on a wiring board.

Figure 15:
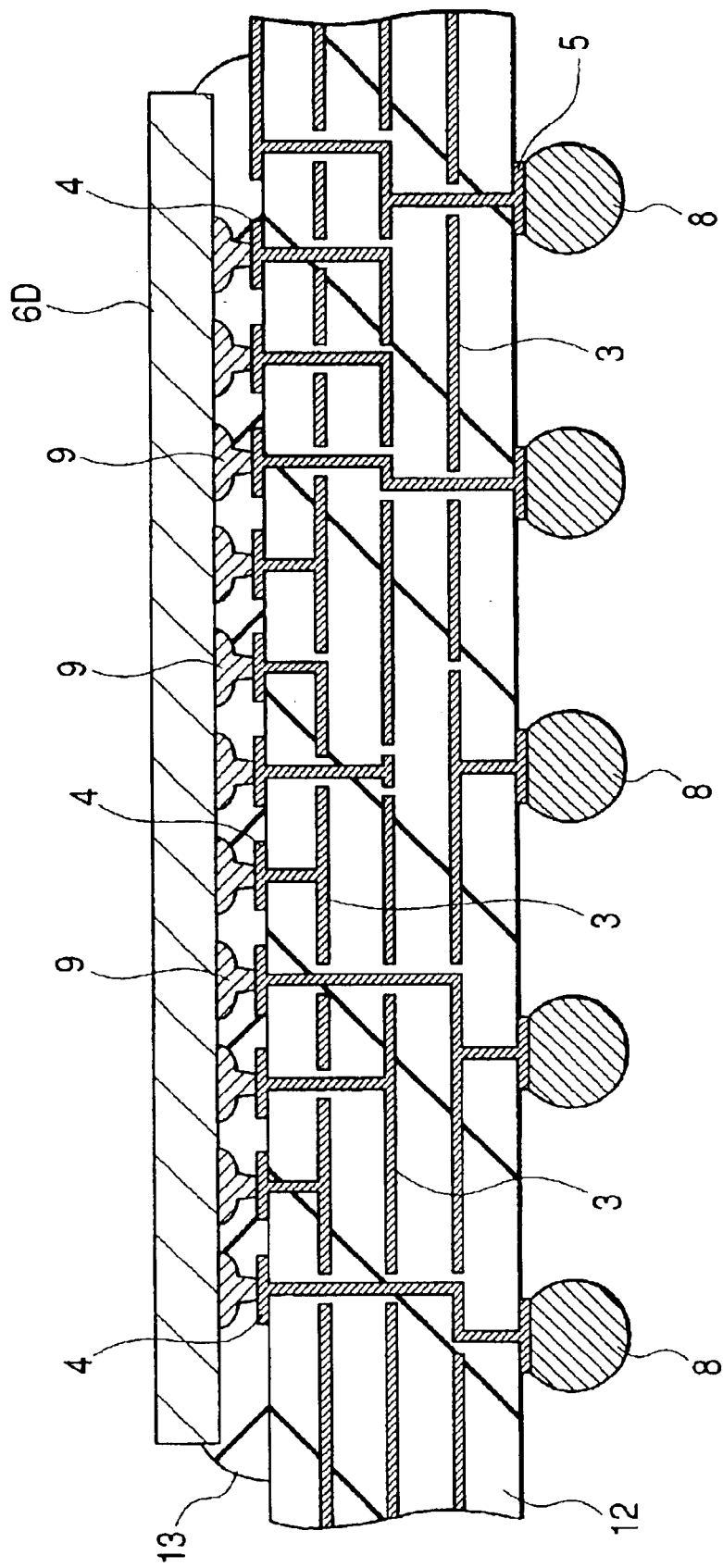
FIG. 15 is a sectional view showing an essential part of a semiconductor device according to another embodiment of the invention.

For instance, FIG. 15 shows another embodiment wherein a plurality of Au bumps 9 formed on a main surface (i.e. an element-forming surface) of silicon chip 6D are electrically connected to electrode pads 4 of a wiring board 12, thereby providing a semiconductor device wherein an underfill resin (sealing resin) is filled in the space between the silicon chip 6D and the wiring board 12. The underfill resin 13 is constituted, for example, of a silica filler-containing thermosetting epoxy resin, and the wiring board 12 is constituted, for example, of a glass fiber-impregnated epoxy resin.

In order to fill the underfill resin 13 in the space between the silicon chip 6D and the wiring board 12, the Au bumps 9 of the silicon chip 6D are electrically connected to the electrode pads 4 of the wiring board 12, after which a liquid underfill resin 13 is supplied to the outer periphery of the silicon chip 6D by use, for example, of a dispenser. Subsequently, the wiring board 12 its heated to about 70° C. for increasing the fluidity of the underfill resin 13. In this way, the underfill resin 13 is filled in the space between the silicon chip 6D and the wiring board 12 by a capillary action. Thereafter, the wiring board 12 is thermally heated at about 150° C. to cure the underfill resin 13.

For the underfill resin 13 filled in the space between the silicon chip 6D and the wiring board 12, an uncured epoxy resin processed as a film may be used in place of a liquid resin. In this case, a film cut about the same size as the silicon chip 6D is interposed between the Au bumps 9 and the electrode pads 4, like Embodiment 1, under which the wiring board 12 is heated to about 150° C. to melt and cure the film.

In such a semiconductor device as stated above, where the Au bumps 9 formed on the silicon chip 6D are narrow in pitch and the electrode pads 4 of the wiring board 12 correspondingly becomes small in pitch and width, the total pitch of the electrode pads 4 has been beforehand made smaller than the total pitch of the Au bumps while taking into consideration the difference in coefficient of thermal expansion between the silicon chip 6D and the wiring board 12. This prevents the misregistration between the Au bumps 9 and the electrode pads 4 in the course of thermal treatment. In this manner, an appropriate area of contact between the silicon chip 6D and the wiring board 12 is ensured, and thus, reliability of contact therebetween can be improved without using an expensive ceramic substrate.

Figure 16:
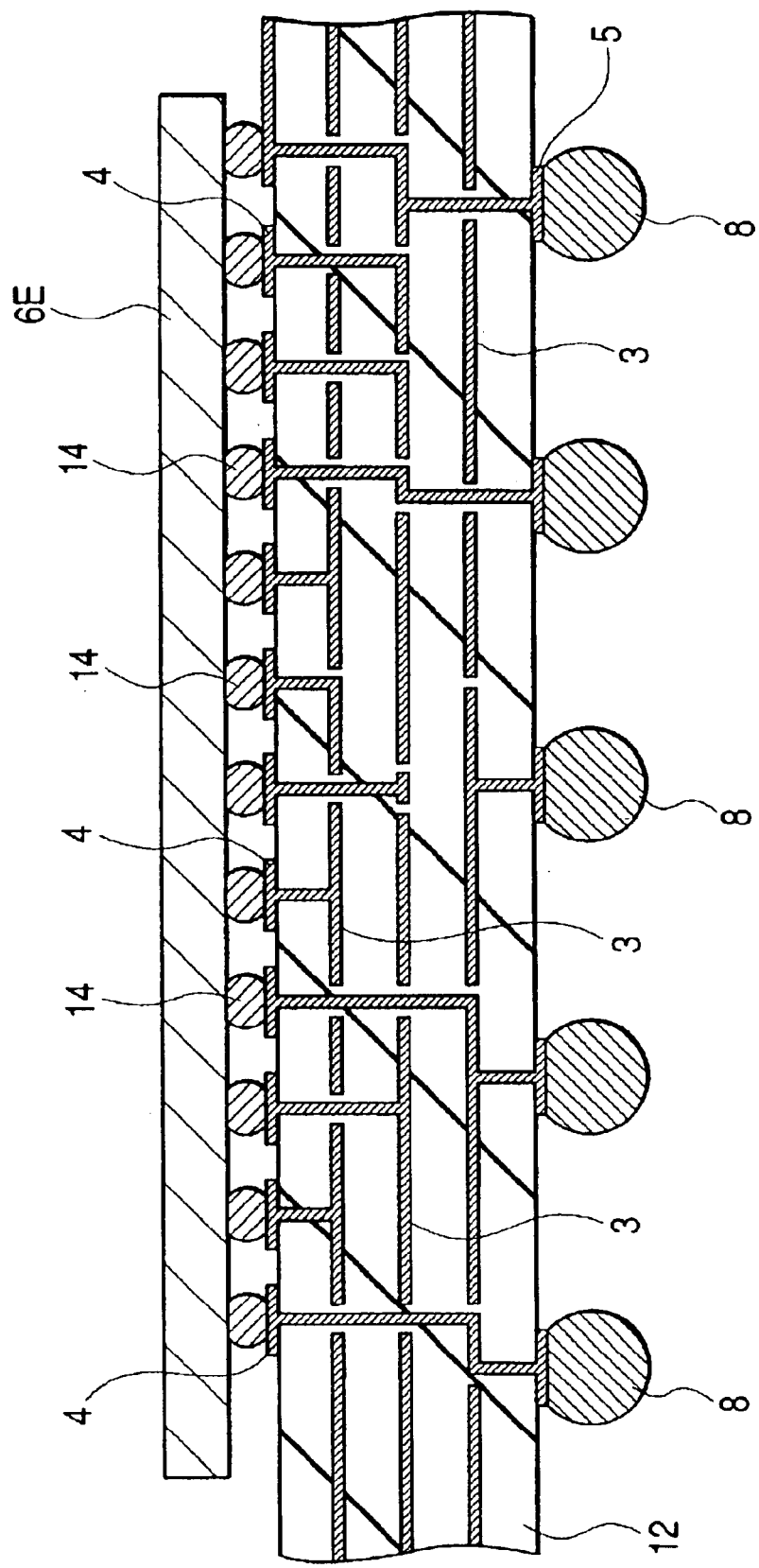
FIG. 16 is a sectional view showing an essential part of a semiconductor device according to a further embodiment of the invention.
Figure 17:
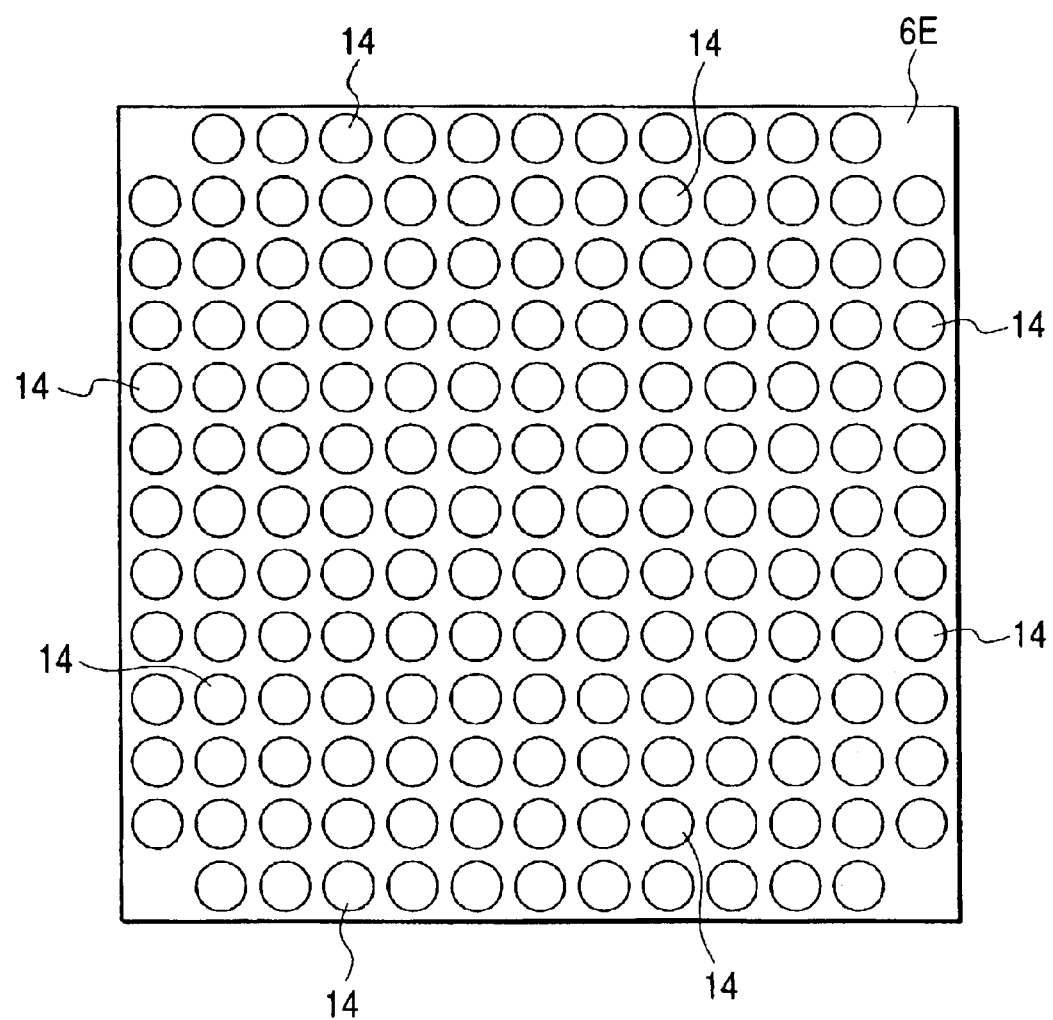
FIG. 17 is a plan view showing a main surface of a silicon chip according to a still further embodiment of the invention.

FIG. 16 shows a semiconductor device wherein a plurality of solder bumps 14 formed on the main surface (element-forming surface) of a silicon chip 6E are electrically connected to the electrode pads 4 of the wiring board 12. As shown in FIG. 17, the solder bumps 14 are constituted, for example, of a solder material having a relatively low melting point such as an Sn—Ag alloy (melting point of 221° C.) containing 3 wt % of Ag. The wiring board 12 is constituted, for example, of a glass fiber-impregnated epoxy resin.

In such a semiconductor device as stated above, a high temperature thermal treatment is effected in the step of re-flowing the solder bumps 14. Where the solder bumps 14 formed on the silicon chip 6E are narrow in pitch with the attendant narrow pitches of the electrode pads 4 of the wiring board 12, the total pitch of the electrode pads 4 has been preliminarily made smaller than the total pitch of the solder bumps 14 while taking into consideration the difference in coefficient of thermal expansion between the silicon chip 6E and the wiring board 15. This prevents the misregistration between the solder bumps 14 and the electrode pads 4 in the course of the thermal treatment to ensure an appropriate area of contact therebetween. Thus, reliability of contact between the silicon chip 6E and the wiring board 12 can be improved without use of an expensive ceramic substrate. In order to prevent distortion or breakage of the solder bumps 14 accompanied by cooling of the semiconductor device after the thermal treatment, it is recommended to fill and fix an underfill resin (sealing resin) in the space between the silicon chip E and the wiring board 15. In this connection, it is preferred that for making the distortion and internal stress occurring in the solder bumps 14 small, the underfill resin is solidified while heating the wiring board 15 and the silicon chip 6E to a level close to a thermal treating temperature 14 in the reflowing step, thereby permitting the silicon chip 6E and the wiring board 15 to be fixed therewith. More particularly, the curing step of the underfill resin is preferably carried out in such a way that a thermosetting or thermoplastic resin is solidified in the space between the silicon chip 6E and the wiring board 15 at a temperature higher than a temperature at which the semiconductor device is operated and lower than a melting point of the solder bump.

Although the embodiments of the invention made by us have been particularly described, the invention is not limited to those embodiments, and many changes and modifications may be possible without departing from the spirit and scope of the invention.

The invention may be applied to a multi chip module wherein chips in which Au bumps are connected to electrode pads through an isotropic conductive resin, respectively, and chips in which Au bumps or solder bumps are directly connected to electrode pads are mounted on the same wiring board as mixed. In addition, the invention is applicable to a package wherein single chips are mounted on a wiring board by any of the methods set out hereinbefore.

The invention is also applicable not only to the flip chip mounting of chips having narrow pitches of bump electrodes on a wiring board, but also to flip chip mounting of chips with a large area on a wiring board. The chip with a large area has a great total pitch of bump electrodes and a great total pitch of electrode pads at the side of the wiring board, so that if the pitches of the electrode pads are relatively wide, the degree of misregistration between the bump electrodes and corresponding electrode pads becomes great in the course of thermal treatment carried out in a chip mounting step. Accordingly, the application of the invention to such mounting as mentioned above can improve the reliability of connection between the bump electrodes and the electrode pads.

The effects of a typical embodiment according to the invention can be summarized as follows.

While taking a difference in coefficient of thermal expansion between a chip having bump electrodes with narrow pitches into account when mounting the chip on a wiring board, the total pitch of the electrode pads has been beforehand made smaller than the total pitch of the bump electrodes. Eventually, the misregistration between the bump electrodes and the electrode pads ascribed to the different in coefficient of thermal expansion between the chip and the wiring board can be prevented, ensuring an appropriate area of contact therebetween.

What is claimed is:

1. A method of manufacturing a semiconductor device comprising the steps of:
   (a) providing a semiconductor chip having a main surface in which a plurality of bump electrodes are formed;
   (b) providing a wiring board having a main surface on which a plurality of electrodes are formed;
   (c) arranging the semiconductor chip on the main surface of the wiring board so that the plurality of bump electrodes of the semiconductor chip and the plurality of electrodes of the wiring board are individually connected in face-to-face relation with one another, and curing a resin between the main surface of the wiring board and the main surface of the semiconductor chip with heat treatment to fix the wiring board and the semiconductor chip with the cured resin, wherein the wiring board has a coefficient of thermal expansion larger than a coefficient of thermal expansion of the semiconductor chip, and in the step (b) prior to the step (c), the plurality of bump electrodes of the semiconductor chips have pitches wider than corresponding pitches of the plurality of electrodes of the wiring board at a temperature lower than a temperature of the heat treatment.

2. A method of manufacturing a semiconductor device according to claim 1, wherein the plurality of bump electrodes formed on the main surface of the semiconductor chip are made of Au.

3. A method of manufacturing a semiconductor device according to claim 1, wherein the plurality of bump electrodes are arranged at a periphery of the main surface of the semiconductor chip.

4. A method of manufacturing a semiconductor device according to claim 1, including, in the step (c), applying compression pressure to the semiconductor chip by a pressurizing tool.

5. A method of manufacturing a semiconductor device comprising the steps of:
   (a) providing a semiconductor chip having a main surface on which a plurality of bump electrodes are formed,
   (b) providing a wiring board having a main surface on which a plurality of electrodes are formed;
   (c) arranging the semiconductor chip on the main surface of the wiring board so that the plurality of bump electrodes of the semiconductor chip and the plurality of electrodes of the wiring board are individually connected in face-to-face relation with one another, and curing a resin between the main surface of the wiring board and the main surface of the semiconductor chip with heat treatment to fix the wiring board and the semiconductor chip with the cured resin, wherein the wiring board has a coefficient of thermal expansion larger than a coefficient of thermal expansion of the semiconductor chip, and a distance ranging from one end to another of an array of the plurality of electrodes formed on the main surface of the wiring bard provided in the step (b) is smaller than a distance ranging from one end to another of an array of the plurality of bump electrodes formed on the main surface of the semiconductor chip provided in the step (a).

6. A method of manufacturing a semiconductor device according to claim 5, wherein the plurality of bump electrodes formed on the main surface of the semiconductor chip are made of Au.

7. A method of manufacturing a semiconductor device according to claim 5, wherein the plurality of bump electrodes are arranged at a periphery of the main surface of the semiconductor chip.

8. A method of manufacturing a semiconductor device according to claim 5, including, in the step (c), applying compression pressure to the semiconductor chip by a pressurizing tool.

* * * * *